(12) United States Patent
Minixhofer

(10) Patent No.: US 7,683,449 B2
(45) Date of Patent: Mar. 23, 2010

(54) RADIATION-DETECTING OPTOELECTRONIC COMPONENT

(75) Inventor: Rainer Minixhofer, Unterpremstatten (AT)

(73) Assignee: Austriamicrosystems AG, Unterpremstätten (AT)

( * ) Notice: Subject to any disclaimer, the term of this patent is extended or adjusted under 35 U.S.C. 154(b) by 0 days.

(21) Appl. No.: 10/578,960

(22) PCT Filed: Oct. 8, 2004

(86) PCT No.: PCT/EP2004/011304

§ 371 (c)(1),
(2), (4) Date: Mar. 30, 2007

(87) PCT Pub. No.: WO2005/048355

PCT Pub. Date: May 26, 2005

(65) Prior Publication Data

US 2007/0278604 A1    Dec. 6, 2007

(30) Foreign Application Priority Data

Nov. 12, 2003   (DE) ................... 103 52 741

(51) Int. Cl.
*H01L 21/00* (2006.01)
(52) U.S. Cl. ............... 257/432; 257/440; 257/E31.032; 438/69; 438/74
(58) Field of Classification Search ............ 257/432, 257/438, 461, 431, 464, 414, 440, E31.032, 257/E31.038; 438/69, 70, 74
See application file for complete search history.

(56) References Cited

U.S. PATENT DOCUMENTS

| 3,569,997 | A |   | 3/1971  | Lehovec |
|-----------|---|---|---------|---------|
| 3,704,377 | A |   | 11/1972 | Lehovec |
| 3,763,372 | A | * | 10/1973 | Fedotowsky et al. ........ 257/280 |
| 4,016,416 | A |   | 4/1977  | Shepherd, Jr. et al. |
| 4,870,674 | A |   | 9/1989  | Schmahl et al. |
| 5,497,269 | A |   | 3/1996  | Gal |
| 5,682,266 | A | * | 10/1997 | Meyers ...................... 359/571 |

(Continued)

FOREIGN PATENT DOCUMENTS

DE    1 764 639    2/1971

(Continued)

OTHER PUBLICATIONS

English translation of International Preliminary Examination Report for PCT/EP2004/011304.

*Primary Examiner*—Lex Malsawma
*Assistant Examiner*—Robert Huber
(74) *Attorney, Agent, or Firm*—Fish & Richardson P.C.

(57) ABSTRACT

An optoelectronic component that includes a semiconductor device and an optical component is disclosed. The semiconductor device includes at least one radiation-sensitive zone configured to detect electromagnetic radiation. The optical element for focusing is configured to focus the electromagnetic radiation in the at least one radiation-sensitive zone. The optical element includes a diffractive element having structures on the order of magnitude of the wavelength of the electromagnetic radiation.

15 Claims, 1 Drawing Sheet

U.S. PATENT DOCUMENTS

| | | |
|---|---|---|
| 5,965,875 A | 10/1999 | Merrill |
| 6,150,683 A * | 11/2000 | Merrill et al. ............... 257/292 |
| 6,221,687 B1 | 4/2001 | Abramovich |
| 6,281,561 B1 | 8/2001 | Stiebig |
| 6,362,498 B2 | 3/2002 | Abramovich |
| 7,129,466 B2 * | 10/2006 | Iwasaki .................. 250/214.1 |
| 2002/0190254 A1* | 12/2002 | Turner et al. ................. 257/59 |
| 2002/0197763 A1 | 12/2002 | Yeh et al. |
| 2003/0038296 A1 | 2/2003 | Merrill |

FOREIGN PATENT DOCUMENTS

| | | |
|---|---|---|
| DE | 36 42 457 | 6/1988 |
| DE | 195 18 303 | 11/1996 |
| DE | 197 37 561 | 4/1999 |
| EP | 0 307 484 | 3/1989 |
| EP | 0 585 094 | 3/1994 |
| EP | 0 807 982 | 11/1997 |

* cited by examiner

RADIATION-DETECTING OPTOELECTRONIC COMPONENT

TECHNICAL FIELD

This patent application describes an optoelectronic component, a method of fabricating such a component, and use of a zone plate in such a component.

BACKGROUND

The sensitivity of radiation-detecting semiconductor components can be improved by focusing the radiation to be detected in the light-sensitive zones. E.g., U.S. Pat. No. 6,221,687 and U.S. Pat. No. 6,362,498 disclose image sensors which contain integrated arrays of microlenses which serve to focus the received radiation on a photodiode. In the image sensors disclosed in those documents, color filters are employed to achieve sensitivity to particular wavelengths or colors. A similar component is disclosed in US 2002/0197763 A1.

Other embodiments of color-sensitive radiation-detecting semiconductor components are disclosed in U.S. Pat. No. 5,965,875 and US 2003/0038296 A1. In these components, the semiconductor bodies contain a plurality of radiation-sensitive p-n transitions which are disposed mutually vertically. The color sensitivity results from the fact that short-wave photons are preferentially absorbed in the upper zones of the semiconductor body, due to stronger absorption in the semiconductor, and photons with longer wavelength are preferentially absorbed in the deeper lying zones of the semiconductor body.

In the above-described radiation-detecting components, the focusing of the radiation is accomplished with refractive optical elements, which elements are substantially larger than the wavelength of the radiation.

For focusing and/or deflection of light, diffractive elements are known which are based on the principle of diffraction and which have structures of the order of magnitude of the light wavelength(s). An example of such a diffractive focusing element is a zone plate. Zone plates are used in particular in the area of technology of x-ray radiation, for focusing of radiation, where the use of lenses is impracticable because of the small differences in the index of refraction between different materials, and because of the high absorption. An example of such a use is an x-ray microscope disclosed in DE 364257 A1 [sic].

Zone plates are comprised of structures of concentric rings, with the widths of the rings decreasing with progression in the inward direction. In dimensioning of such zone plates, a distinction must be made between utilization of diffraction in the near-field region (Fresnel diffraction) and utilization of diffraction in the far-field region (Fraunhofer diffraction).

The engineering design and dimensioning of Fresnel zone plates is known from, e.g., Hecht, E., 1989, "Optik" (in English, "Optics"), published by Addison-Wesley. Further, a distinction is made between amplitude zone plates and phase zone plates. In amplitude zone plates the radiation of each second Fresnel zone is shielded by an absorbent material, whereas in a phase zone plate a path difference (difference in the path of the radiation) is produced between two neighboring zones in that the materials of the zones differ in index of refraction and/or thickness. With both types of zone plates, beneficial ("constructive") interference occurs at the focal loci, the positions of which loci depend on the wavelength of the incident radiation.

SUMMARY

An improved radiation-detecting optoelectronic component which is distinguished by improved sensitivity and the possibility of wavelength-selective radiation detection is disclosed. Further, a fabrication process for such an optoelectronic component is disclosed.

In an optoelectronic component with a semiconductor chip which chip has at least one radiation-sensitive zone for detection of electromagnetic radiation, and with an optical element for focusing the electromagnetic radiation in the radiation-sensitive zone(s), the optical element is a diffractive optical element.

An advantage of use of a diffractive element to focus the electromagnetic radiation in the radiation-sensitive zones is that the structures of the diffractive elements which are of the order of magnitude of the wavelength of the electromagnetic radiation can be produced by a photolithographic process of a type which is customary in the fabrication of semiconductor chips. In particular, metallic and/or dielectric layers which are already present in integrated circuits, e.g. in CMOS technology, can be utilized for fabricating the diffractive element.

In comparison to refractive optical elements, it is particularly advantageous that a diffractive optical element can be produced as a flat structure in the plane of the semiconductor chip. Consequently, for example, it is unnecessary to employ the technically relatively expensive method of manufacturing convex structures in the direction of the incident radiation, which convex structures extend transversely and/or at an angle to the plane of the semiconductor chip, as is necessary when microlenses are employed.

The radiation to be detected may have a wavelength of, e.g., between c. 100 nm (in the ultraviolet spectral region) and c. 5 micron (in the infrared spectral region). In particular the radiation to be detected may comprise light in the visible spectral range of c. 400-800 nm.

The distance between the diffractive element and a radiation-sensitive zone of the semiconductor chip is preferably less than 20 micron.

The diffractive element may be, in particular, a zone plate. For the Fresnel number F of the zone plate, preferably the following applies:

$$F = \frac{D^2}{\lambda R} > 1,$$

where D is the diameter of the zone plate, and

R is the distance between the zone plate and the radiation-sensitive zone in which zone the radiation with wavelength lambda is detected. The radiation-sensitive zone is in the near-field region of the zone plate, thus where the zone plate acts as a Fresnel zone plate.

The semiconductor chip may have a single radiation-sensitive zone or a plurality of radiation-sensitive zones. It is particularly advantageous if the chromatic aberration of a zone plate is exploited so as to achieve color-sensitivity of the radiation-detecting component. Preferably, for this purpose a plurality of radiation-sensitive zones are disposed in succession with progression in the incidence direction of the light, with the radiation-sensitive zones for shorter wavelengths being disposed behind (downstream of) the radiation-sensitive zones for longer wavelengths. Thus the zone plate provides simultaneously both focusing of the radiation and wavelength selectivity. E.g., one can provide three radiation-sensitive zones which are disposed in respective focal planes for the respective primary colors (red, green, blue).

The zone plate may be, e.g., an amplitude zone plate, wherein the zones are alternately comprised of a transparent material and an absorbing material. The absorbing material is, e.g., a metal.

Preferably the zone plate is a binary phase zone plate, wherein alternate zones are each comprised of one of two respective transparent materials. E.g., these materials may comprise a silicon oxide or a silicon nitride. Because with a phase zone plate, in contrast to the situation with an amplitude zone plate, one does not have half of the zones shielded by absorption, with a phase zone plate the amplitude of the radiation at the focal loci is about 2 times greater than the amplitude at the focal loci of an amplitude zone plate; and thus the intensity is about 4 times greater.

Embodiments of the optoelectronic component are described below with reference to FIGS. 1 and 2.

DETAILED DESCRIPTION

Figure 1:
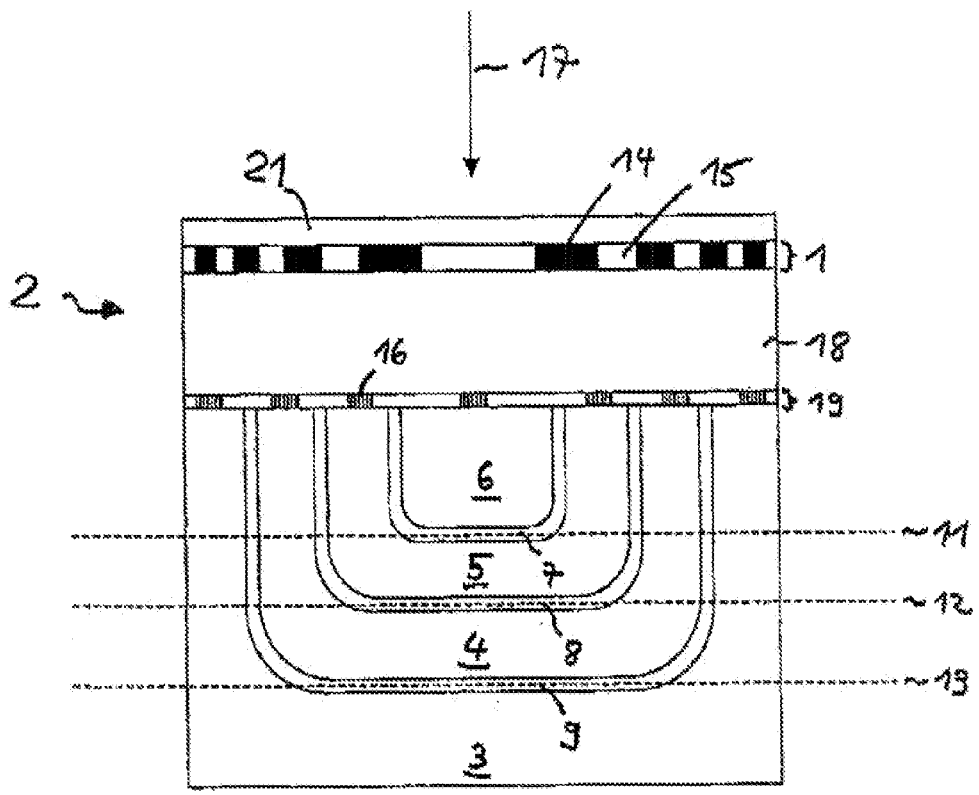
FIG. 1 is a schematic cross section though an exemplary embodiment of an optoelectronic component.

In the Figures, identical or similar or similarly functioning elements bear like reference numerals.

The radiation-detecting semiconductor chip 2 (FIG. 1) has n-doped regions (4, 6) and p-doped regions (3,5) which are formed in the basic material, which material is, e.g., silicon. The transition regions between the p-doped and n-doped regions function as radiation-sensitive zones (7, 8, 9). Electrical contacting and switching of the semiconductor element can be accomplished, e.g., in a (flat) contacting region 19, by metallic track conductors 16.

Electromagnetic radiation 17 incident on the semiconductor chip 2 is focused in the radiation-sensitive zones (7, 8, 9), by means of a zone plate 1. This focusing increases the sensitivity of the component and also achieves color-dependent sensitivity as a result of the chromatic aberration properties of the zone plate. In contrast to a lens, with the zone plate the focal length decreases with increasing wavelength. Thus one can provide wavelength-selective radiation detection, if one disposes a plurality of radiation-sensitive zones (7, 8, 9) in succession with progression in the incidence direction of the light 17, with the radiation-sensitive zones for shorter wavelengths being disposed behind (downstream of) the radiation-sensitive zones for longer wavelengths.

For example, the semiconductor chip 2 has a radiation-sensitive zone 7 in focal plane 11, for red light; and disposed behind this in the direction of the incident light 17 a second radiation-sensitive zone 8 in focal plane 12, for green light; and disposed behind this a third radiation-sensitive zone 9 in focal plane 13, for blue light. Thus in this example a radiation detector for the three primary colors is thus realized. Other numbers of radiation-detecting zones, and other choices of wavelength ranges to be detected, are possible.

Preferably the zone plate 1 is an integral component of the semiconductor chip 2. E.g., inside the semiconductor chip, above the contacting region 19 in which region the metallic track conductors 16 are formed, a dielectric layer 18 is disposed over which a metallic or dielectric layer is applied in which the structure of the zone plate 1 is formed by photo-lithographic structuring. The zone plate 1 has a structure of concentric rings consisting of alternating regions (14, 15) comprised of different materials. The regions (14, 15) may be formed from materials with different indices of refraction ($n_1$, $n_2$), or respectively an absorbent and a transparent material. The zone plate may be covered, e.g. by a transparent layer 21, which serves in particular to protect the zone plate; alternatively, the zone plate may be formed on the surface of the semiconductor chip 2.

The layers of which the contacting region 19 and the zone plate 1 are comprised, and the dielectric layer 18 between said layers, are advantageously parts of the layer structure of an integrated circuit. Because integrated circuits comprise a sequence of layers comprised of metallic and dielectric layers, the zone plate 1 may advantageously be produced in (or on) one of the layers already present, using a process of a type which is customarily employed, e.g. photolithography. This will advantageously reduce the fabrication cost.

Another advantage of integration of the zone plate 1 into the semiconductor chip 2 is that, in comparison to installation of a separately fabricated zone plate, no additional expense for adjustment is incurred. In particular, as a result of the integrated construction of the zone plate 1, the zone plate 1 cannot fall out of adjustment; whereas if the zone plate 1 were not so integrated it would be possible for the focal planes (11, 12, 13) to be shifted with respect to the radiation-sensitive zones (7, 8, 9).

Figure 2:
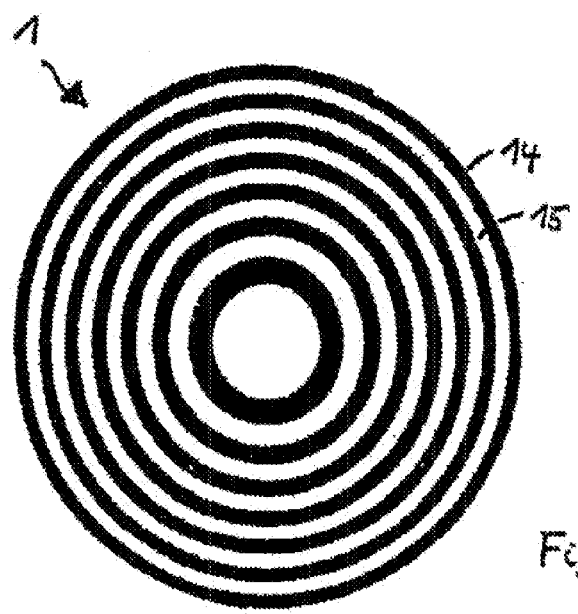
FIG. 2 is a schematic view of an exemplary embodiment of a zone plate.

FIG. 2 shows a schematic depiction of a Fresnel zone plate 1 containing 7 zones, designed for a focal length of 3 micron with a wavelength of 550 nanometer (nm). In this example, the diameter of the zone plate 1 is D=12.32 micron and the width of the outermost ring zone is 307 nm.

The zone plate 1 can be either an "amplitude zone plate" or a "phase zone plate". An amplitude zone plate is comprised of alternate light-impermeable ring-shaped zones 14 and light-permeable ring-shaped zones 15. The light-impermeable ring-shaped zones 14 contain, e.g., a metal, and the light-permeable ring-shaped zones 15 contain, e.g., a dielectric; alternately, the light-permeable zones 15 may be free of material.

If the zone plate 1 is a phase zone plate, it is comprised of ring-shaped zones 14 comprised of a material with an index of refraction $n_1$ and neighboring ring-shaped zones 15 comprised of a material with an index of refraction $n_2$, both of which are light-permeable.

The two light-permeable materials may be, e.g., a silicon oxide and a silicon nitride. These materials have the advantage that they are customarily present in the structures of integrated circuits; thus it is relatively easy to produce the zone plate as an integrated part of the fabrication of an integrated circuit. Examples of indices of refraction of these materials are for wavelength lambda=550 nm:
$n_{SiO2}$=1.46, and $n_{Si3N4}$=2.05.

In order to provide a difference in path length of one wavelength lambda, between the ring-shaped zones (14, 15) comprised of these materials, the thickness d of the zone plate 1 must be:

$$d = \frac{\lambda}{n_{Si3N4} - n_{SiO2}} = 932\,\text{nm}$$

Such a layer thickness is in a range of layer thicknesses which are common in semiconductor device fabrication. Under the assumption that an amplitude zone plate will absorb approximately half of the incident radiation, the intensity at the focal locus of a phase zone plate will advantageously be approximately 4 times greater than with an amplitude zone plate.

TABLE 1

| $\lambda_0$(nm) | D(µm) | $l_{min}$(nm) | f(µm) $\lambda$ = 850 nm | f(µm) $\lambda$ = 650 nm | f(µm) $\lambda$ = 550 nm | f(µm) $\lambda$ = 450 nm | f(µm) $\lambda$ = 300 nm |
|---|---|---|---|---|---|---|---|
| 850 | 17.61 | 550 | 7 | 9.27 | 11.01 | 13.51 | 20.36 |
| 650 | 14.96 | 451 | 5.62 | 7 | 9.33 | 10.23 | 15.44 |
| 550 | 13.57 | 401 | 4.41 | 5.88 | 7 | 8.61 | 13.01 |
| 450 | 12.09 | 350 | 3.55 | 4.76 | 5.68 | 7 | 10.59 |
| 300 | 10.59 | 297 | 2.28 | 3.10 | 3.72 | 4.60 | 7 |

In Table 1, advantageously the diameter D and the minimum structure size $l_{min}$ of the outer ring-shaped zone are given for zone plates which have a given focal length, e.g. $f_0$=7 micron, for a given basic wavelength lambda$_0$. The values of the diameter D and minimum structure size $l_{min}$ are applicable to zone plates with 5 zones. As a result of chromatic aberrations, the focal lengths vary; focal lengths for various wavelengths in the range lambda=300 nm to lambda=850 nm are given, for the various zone plates.

The focal length f of a zone plate which has focal length $f_0$ at the basic wavelength lambda$_0$ is as follows at wavelength lambda:

$$f = \frac{\lambda}{4} + \frac{4f_o\lambda_o + \lambda_0^2}{4\lambda}$$

For wavelengths smaller than the basic wavelength lambda$_0$ the focal length of the zone plate increases, whereas for wavelengths greater than said basic wavelength the focal length of the zone plate decreases. For a given focal length $f_0$, the minimum structure size $l_{min}$ of the zone plate decreases with decreasing basic wavelength lambda$_0$. As indicated in the Table, e.g., for lambda$_0$=850 nm $l_{min}$ is 550 nm, and for lambda$_0$=300 nm $l_{min}$ is 297 nm.

Structures of these sizes can be produced with photolithography. E.g., first a photoresist layer is applied to a throughgoing metal layer, and a mask is projected over the photoresist layer, which mask contains the structure of the zone plate. Preferably the mask formed on the photoresist is in substantially reduced (scaled down) form [sic], in order to avoid the mask itself operating as a zone plate which serves to focus the light employed for exposing the photoresist. The photoresist is then developed, wherewith, e.g., the photoresist is dissolved away at the locations which are exposed; and subsequently the ring structure is etched at the locations which are not covered by the photoresist. The etching process may be, e.g., an anisotropic etching process. The intermediate spaces between the ring-shaped zones are then selectively filled with the dielectric or remain free.

In the case of a "phase zone plate", the zone plate structure is etched into a first dielectric and is then filled with a second dielectric. In the case of a zone plate on the surface of a semiconductor chip, the intermediate spaces may also be left free after the etching process. Preferably, the surface is then planarized, e.g. by chemical and mechanical polishing (CMP).

The description of the invention with reference to exemplary embodiments obviously should not be understood to constitute limitation of the scope of the invention to such embodiments. Rather, the invention encompasses the disclosed features individually and in any combination, even if the combinations are not set forth explicitly in the claims.

The invention claimed is:

1. An optoelectronic component comprising:
a semiconductor device comprising at least three radiation-sensitive zones that are formed in silicon and configured to detect electromagnetic radiation; and
an optical element configured to focus the electromagnetic radiation in the radiation-sensitive zones, the optical element comprising a zone plate having structures with sizes on an order of magnitude of a wavelength of the electromagnetic radiation, and
wherein the radiation-sensitive zones are at varying distances from the optical element such that radiation-sensitive zones configured to detect shorter wavelengths of the electromagnetic radiation are at greater distances from the optical element compared to radiation-sensitive zones configured to detect longer wavelengths of the electromagnetic radiation, wherein the radiation-sensitive zones are in corresponding focal planes of the zone plate for corresponding colors, wherein the radiation sensitive zones comprise: a first radiation-sensitive zone in a focal plane of the zone plate for wavelengths associated with red visible light; a second radiation-sensitive zone in a focal plane of the zone plate for wavelengths associated with green visible light; and a third radiation-sensitive zone in a focal plane of the zone plate for wavelengths associated with blue visible light.

2. The optoelectronic component of claim 1, wherein the zone plate is incorporated in the semiconductor device.

3. The optoelectronic component claim 1, wherein at least one of the radiation-sensitive zones is configured to detect electromagnetic radiation having a wavelength between about 100 nm and about 5 micron.

4. The optoelectronic component of claim 3, wherein at least one of the radiation-sensitive zones is configured to detect electromagnetic radiation in the visible spectral region having a wavelength from about 400 nm to about 800 nm.

5. The optoelectronic component of claim 1, wherein a distance between the zone plate and-at least one of the radiation-sensitive zones is less than about 20 micron.

6. The optoelectronic component of claim 1, wherein:
a first one of the radiation-sensitive zones is configured to detect radiation with a wavelength lambda ($\lambda$); and
the zone plate is at a distance R from the first one of the radiation-sensitive zones and has a diameter D, wherein for a Fresnel number F of the zone plate:

$$F = \left(\frac{D^2}{\lambda R}\right) > 1.$$

7. The optoelectronic component of claim 6, wherein a focal length of the zone plate for radiation with wavelength of about 550 nm is from about 1 micron to about 20 microns.

8. The optoelectronic component of claim 1, wherein the zone plate comprises a layer included in the semiconductor device.

9. The optoelectronic component of claim 8, wherein the layer comprises a metallic layer.

10. The optoelectronic component of claim 1, wherein the zone plate comprises a first transparent material having an index of refraction ($n_1$) and a second transparent material having an index of refraction ($n_2$), $n_1$ being different than $n_2$.

11. The optoelectronic component of claim 10, wherein the first transparent material comprises a silicon oxide and the second transparent material comprises a silicon nitride.

12. The optoelectronic component of claim 1, wherein the zone plate comprises a structured layer included in the semiconductor device.

13. The optoelectronic component of claim 12, wherein the semiconductor device comprises an integrated circuit.

14. A method comprising:
using a zone plate to focus electromagnetic radiation into at least three radiation-sensitive zones of a radiation-detecting semiconductor device, with said radiation-sensitive zones being formed in silicon, wherein the radiation-sensitive zones are at varying distances from the zone plate such that radiation-sensitive zones configured to detect shorter wavelengths of the electromagnetic radiation are at greater distances from the zone plate compared to radiation-sensitive zones configured to detect longer wavelengths of the electromagnetic radiation, wherein using the zone plate to focus electromagnetic radiation into the radiation-sensitive zones comprises: using the zone plate to focus electromagnetic radiation with wavelengths associated with red visible light into a first radiation-sensitive zone; using the zone plate to focus electromagnetic radiation with wavelengths associated with green visible light into a second radiation-sensitive zone; using the zone plate to focus electromagnetic radiation with wavelengths associated with blue visible light into a third radiation-sensitive zone.

15. The optoelectronic component of claim 1, wherein the semiconductor device comprises a semiconductor chip.

* * * * *

UNITED STATES PATENT AND TRADEMARK OFFICE
CERTIFICATE OF CORRECTION

| | |
|---|---|
| PATENT NO. | : 7,683,449 B2 |
| APPLICATION NO. | : 10/578960 |
| DATED | : March 23, 2010 |
| INVENTOR(S) | : Rainer Minixhofer |

It is certified that error appears in the above-identified patent and that said Letters Patent is hereby corrected as shown below:

Col. 6, line 41, claim 3, after "component" insert -- of --.

Col. 6, line 50, claim 5, delete "and-at" and insert -- and at --.

Col. 6, line 67, claim 7, delete "microns" and insert -- micron --.

Signed and Sealed this

Twenty-first Day of September, 2010

David J. Kappos
*Director of the United States Patent and Trademark Office*